United States Patent [19]
Gotoh et al.

[11] Patent Number: 5,341,084
[45] Date of Patent: Aug. 23, 1994

[54] METHOD AND DEVICE FOR DETERMINING AND INDICATING A RESIDUAL CAPACITY OF A BATTERY

[75] Inventors: Seiji Gotoh; Kenji Orita, both of Fukuoka; Tomio Takayama, Kawasaki, all of Japan

[73] Assignee: Fujitsu Limited, Kawasaki, Japan

[21] Appl. No.: 990,591

[22] Filed: Dec. 14, 1992

[30] Foreign Application Priority Data

Dec. 12, 1991 [JP] Japan .................. 3-328824

[51] Int. Cl.$^5$ .................. G01R 31/36; G01N 27/46; H02J 7/10
[52] U.S. Cl. .................. 320/44; 320/48; 340/636; 324/427
[58] Field of Search .............. 320/44, 48; 340/636

[56] References Cited

U.S. PATENT DOCUMENTS 4,947,123  8/1990  Minezawa .................. 320/48 X

FOREIGN PATENT DOCUMENTS

0225106  6/1987  European Pat. Off. .
0359237  3/1990  European Pat. Off. .
3832839  3/1990  Fed. Rep. of Germany .
2361754  3/1978  France .
341378   2/1991  Japan .

*Primary Examiner*—R. J. Hickey

[57] ABSTRACT

In a method and a device for determining and indicating a residual capacity of a battery, a charging amount is measured in a charging mode in which a charger having a sensor for detecting a fully charged state is connected to the battery. If the charging amount in the charging mode is more than a trickle charging amount, the measured charging amount is added to a present charging amount to obtain the present charging amount and a ratio of the present charging amount to a fully charged state is indicated on a display unit. If the charging amount in the charging mode is less than a trickle charging amount, it is judged that the present charging amount is the fully charged amount and this amount is the fully charged state. The device further includes a current-to-voltage converting circuit, an analog-to-digital converter, and an operation control unit such as a MPU connected to the display unit and executing and controlling the operation of the device.

11 Claims, 12 Drawing Sheets

SELECTION TABLE OF DISCHARGE EFFICIENCY

| T(°C) / I(mA) | ~0 | 0~20 | 20~40 | 40~ |
|---|---|---|---|---|
| ~100 | 1.0 | 1.0 | 1.0 | 1.0 |
| 100~300 | 0.8 | 0.9 | 1.0 | 1.0 |
| 300~600 | 0.7 | 0.8 | 0.9 | 1.0 |
| 600~ | 0.6 | 0.7 | 0.8 | 0.9 |

METHOD AND DEVICE FOR DETERMINING AND INDICATING A RESIDUAL CAPACITY OF A BATTERY

BACKGROUND OF THE INVENTION

1. Field of the Invention

The present invention relates to a method and device for determining and indicating the amount of residual charge remaining in a battery, and more particularly to a method and device for determining the residual capacity of a battery when a nickel-cadmium battery or the like is connected to a battery charger equipped with a detector for detecting a fully charged condition and is charged thereby.

2. Description of the Related Art

When a secondary cell such as a nickel-cadmium battery or the like, the output voltage of which is substantially constant, is charged and reaches a fully charged state, a trickle charging current from the battery charger often continues indefinitely, so that it is desirable to determine whether or not a charging operation has been completed. For this reason, it is necessary to connect the secondary cell or battery not only to a trickle charger that provides a so-called microcurrent from the beginning of a charge cycle in the form of a charging current, but also to a charger that has a function of detecting a fully charged state so that a change in the charging current may be made immediately before or after a constant charge has been completed.

In general, in the case of the prior art where the residual capacity of a battery is indicated, there is a well known method and apparatus for measuring and indicating a charging current and discharging current, hereinafter referred to as a charging amount and discharging amount, respectively.

The above-noted charging amount is indicated by a value $I_c \times T_c$ by which a charging current $I_c$ is multiplied by a time $T_c$ and, for example, if a charging current $I_c$ of 50 mA is maintained for ten hours, the charging amount would be $I_c \times T_c = 500$ mAh. When a value of 500 mAh is reached, if the charger detects a full charge, the value of 500 mAh is considered to be the full charging amount.

The discharging amount is designated by the product of $I_D \times T_D$ by which a discharging current $I_D$ is multiplied by a discharging time $T_D$. If $I_D$ is 50 mA and the discharging time is 10 hours, the full discharging amount is 500 mAh, which is designated a dischargeable amount. For a time until a discharge-terminating voltage is reached so that the voltage between both terminals of a battery becomes 1V per cell, 10 mA per hour is discharged and the discharged amount after ten hours is, for example, $I_D \times T_D = 100$ mA, the residual capacity of a battery at this time, or the remaining discharge amount, is indicated as $500-100=400$ mAh.

In the prior art method and device for indicating the residual capacity of a battery, it is assumed that all of the charged amount can be discharged. This causes a problem that the charging amount and the discharging amount are not linearly related on a 1 to 1 ratio based on the charging efficiency or the surrounding environment and an error in the indication of the remaining capacity may occur in the last stage of the discharge processes.

SUMMARY OF THE INVENTION

It is an object of the present invention to provide a method and device for continuously indicating an accurate residual capacity of a battery.

In accordance with an aspect of the present invention, there is provided a method for representing a correct residual capacity of a battery, comprising the steps of: measuring a charging current value in a charging mode where a charger having a function for detecting a fully charged state is connected to the battery; adding, if the charging current value in the charging mode is more than a trickle charging current value, the measured charging amount to a present charging amount to obtain the present charging amount and indicating a ratio of the present charging amount to a fully charged state; and Judging, if the charging current value in the charging mode is less than a trickle charging current value, the present charging amount as the fully charged amount and representing that this amount is in a fully charged state.

In accordance with another aspect of the present invention, there is provided a device for indicating a residual capacity of a battery, comprising: a battery (1); a charger (2) having a function of detecting a fully charged state; a current-to-voltage converting circuit (3) for converting a charging current value to a voltage value when the charger (2) is connected to the battery (1) an analog-to-digital converter (4) connected to said converting circuit for converting the voltage value from the converting circuit (3) to a digital value; and an operational means (5) for detecting whether or not the charger (2) is connected to the battery (1), and in the charging mode when the charger (2) is connected to the battery (1), obtaining a charging current value from a voltage value output from the analog-to-digital converter (4), adding, if the charging current value is more than a trickle charging current value, the charging current value to a present charging amount, to obtain the present charging amount, and outputting to a display unit (6) a ratio of the present charging amount to a full charging amount, and at the same time, judging, if the charging current value is less than the trickle charging current value, the present charging amount as the fully charged amount and representing with the display unit (6) that the present charging amount is in a fully charged state.

DETAILED DESCRIPTION OF THE PREFERRED EMBODIMENTS

Figure 1:
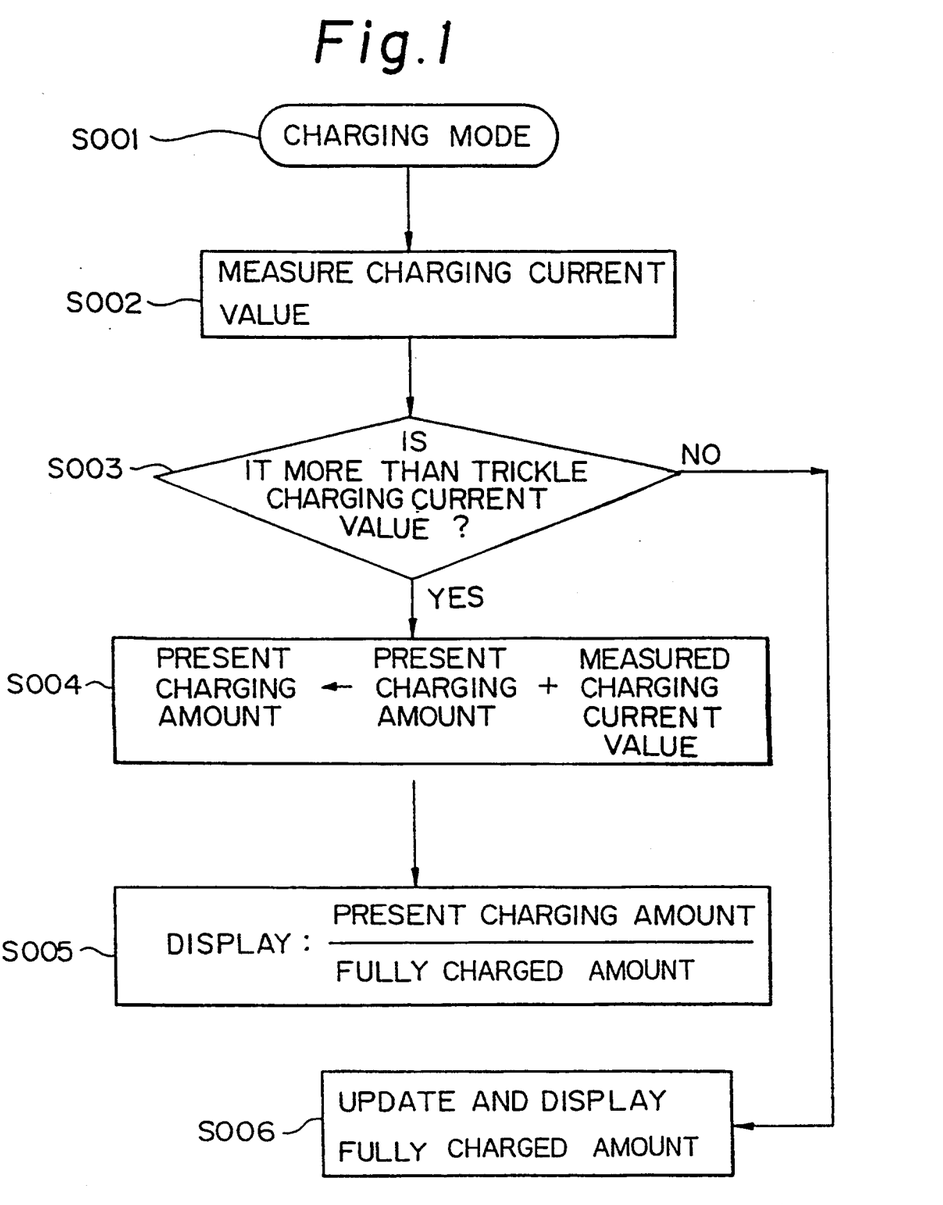
FIG. 1 is a flowchart showing a charging mode in the method for indicating the residual capacity of a battery in accordance with the present invention.

FIG. 1 is a view showing the steps of the method for indicating the residual capacity of a battery in accordance with the present invention.

First, a charging mode (S001), in which a charger having a function for detecting a fully charged state is connected to a battery, is initiated as shown in FIG. 1. Then, charging current value (or charging amount) of a current flowing from the charger in the charging mode (S001) to the battery, is measured (S002). If the charging current value is larger than a trickle charging amount (S003) (or an estimated value for completion of charging), a new present charging amount is obtained (S004) by adding the present charging amount (which is 0 at the starting time) to the measured charging current value (S002).

Since the fully charged amount is judged as a charging current value which has been determined in a preceding charging mode, the present charging amount is divided by the predetermined fully charged amount, to be represented as a ratio of the division (S005).

Figure 4A:
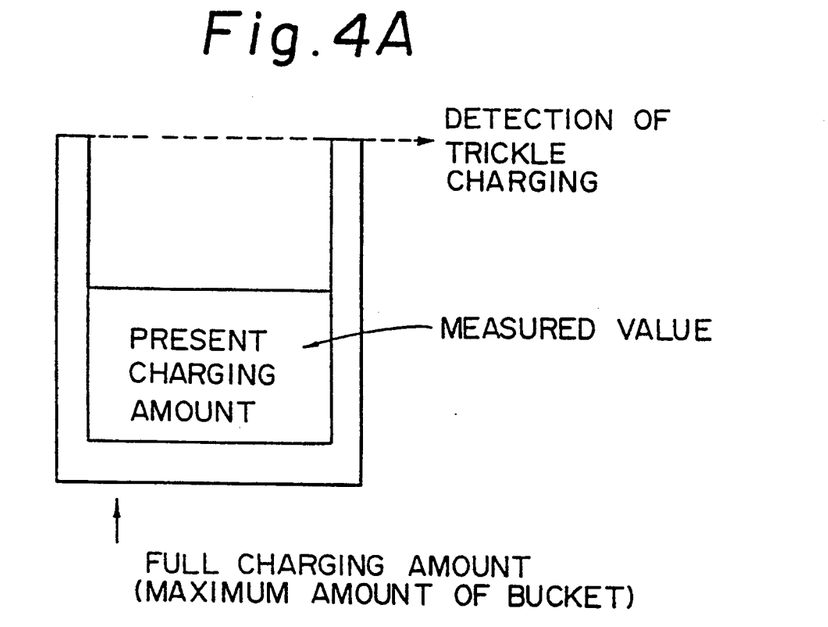
FIGS. 4A and 4B are explanatory views showing current charging amount and current discharging amount, respectively, in the method of the present invention.

If the charging amount is less than a trickle charging current value, since it is considered that the charging operation has already been completed, the present charging amount represents a fully charged state (S006). This fully charged amount is equivalent to the maximum charging current value, as will be shown in an upper part of FIG. 4 where a battery is compared to a bucket.

Figure 2:
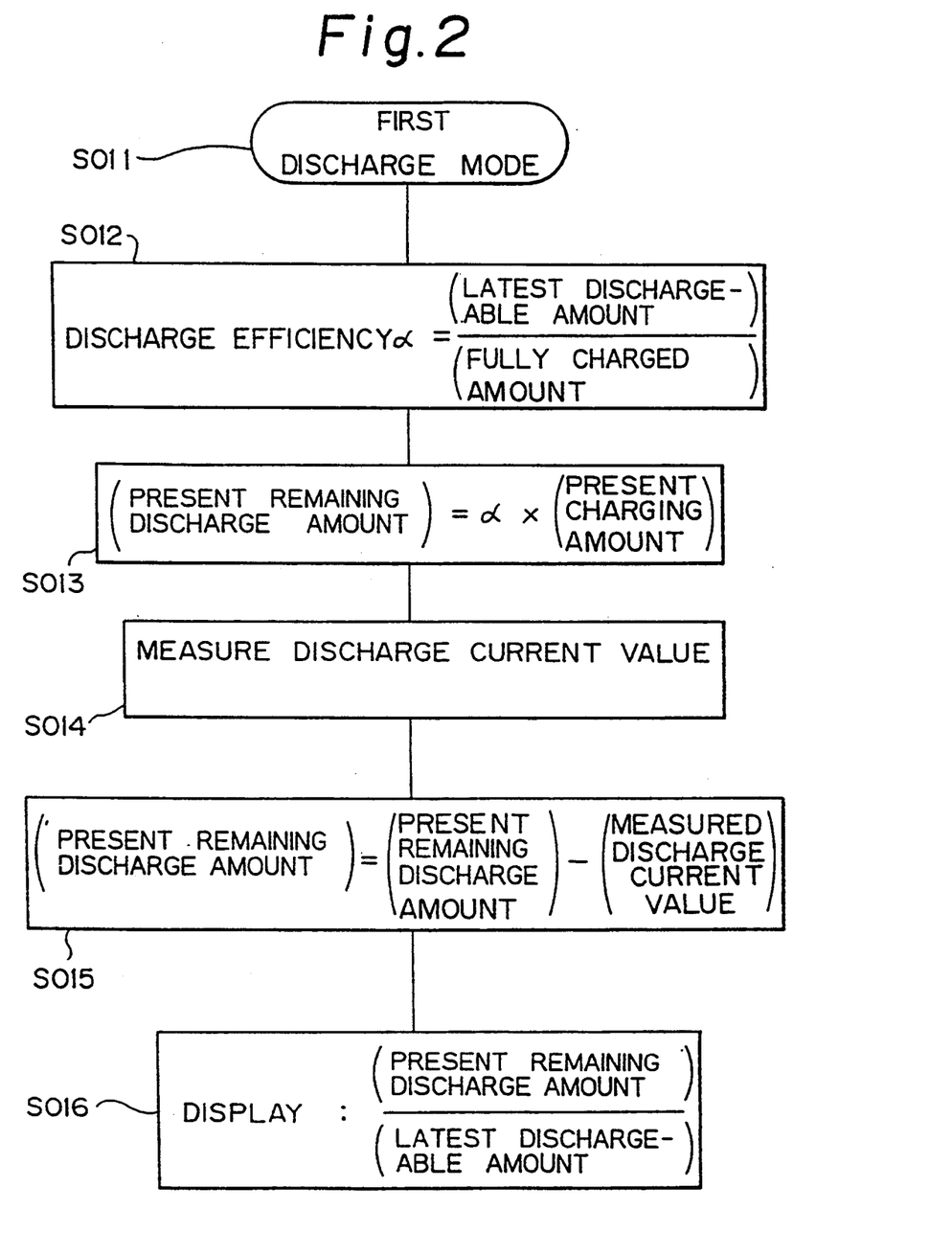
FIG. 2 is a flowchart showing a first discharge mode in the method in accordance with the present invention.

FIG. 2 is a view showing the steps of a discharging mode, after the charging mode operation has been completed, as shown in FIG. 1.

A first discharging mode (S011) is a mode where the charger is removed from the battery after the battery has been charged in the charging mode as shown in FIG. 1. In this mode of step S011, a discharge efficiency α is found by dividing a latest dischargeable amount by a fully charged amount. The discharge efficiency α is a value denoting that to what extent the charged battery will discharge depending on surrounding conditions.

The full charge amount used to determine the discharge efficiency α is a charging amount after trickle charging as shogun in FIG. 1 and FIG. 4(a), and the latest dischargeable amount is equivalent to the dischargeable amount from which is subtracted from a remaining discharge amount (an amount that could not be discharged in the preceding discharge mode when the voltage of the battery has reached a discharge-terminating voltage).

Figure 4B:
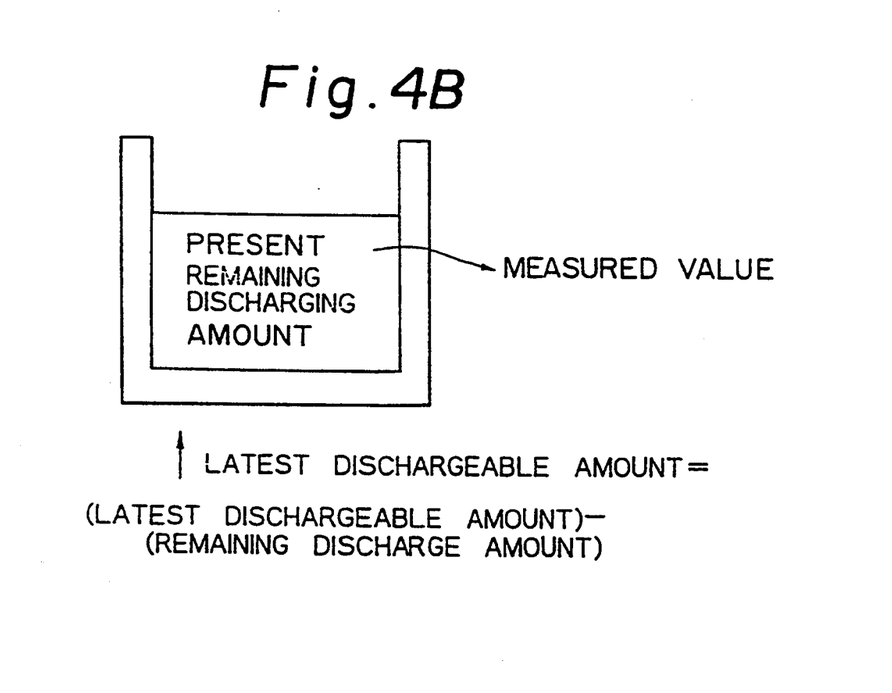

Regarding the discharge efficiency α thus obtained, the present remaining discharge amount (refer to FIG. 4(b)) can be obtained by multiplying the present charging amount (a value determined by the charging mode) by the above-noted discharge efficiency α. Meanwhile, the discharge current value or the discharging amount is measured and an operation in which the above measured discharge amount is subtracted from the present remaining discharge amount is effected to obtain a new present remaining discharge amount (S015).

Further, the above operation when the above estimated present remaining discharge amount (S015) is divided by the latest dischargeable amount (S012) is effected to enable the residual amount of the battery to be denoted as a percentage. (S016).

In FIG. 2, in the discharge mode, when the discharge mode changes back to the charging mode, before the value of the voltage of the battery between both terminals reaches a discharge-terminating voltage, the present remaining discharge amount is divided by the above discharge efficiency α to derive the present charging amount, so the converted value can be used in the charging mode.

Figure 3:
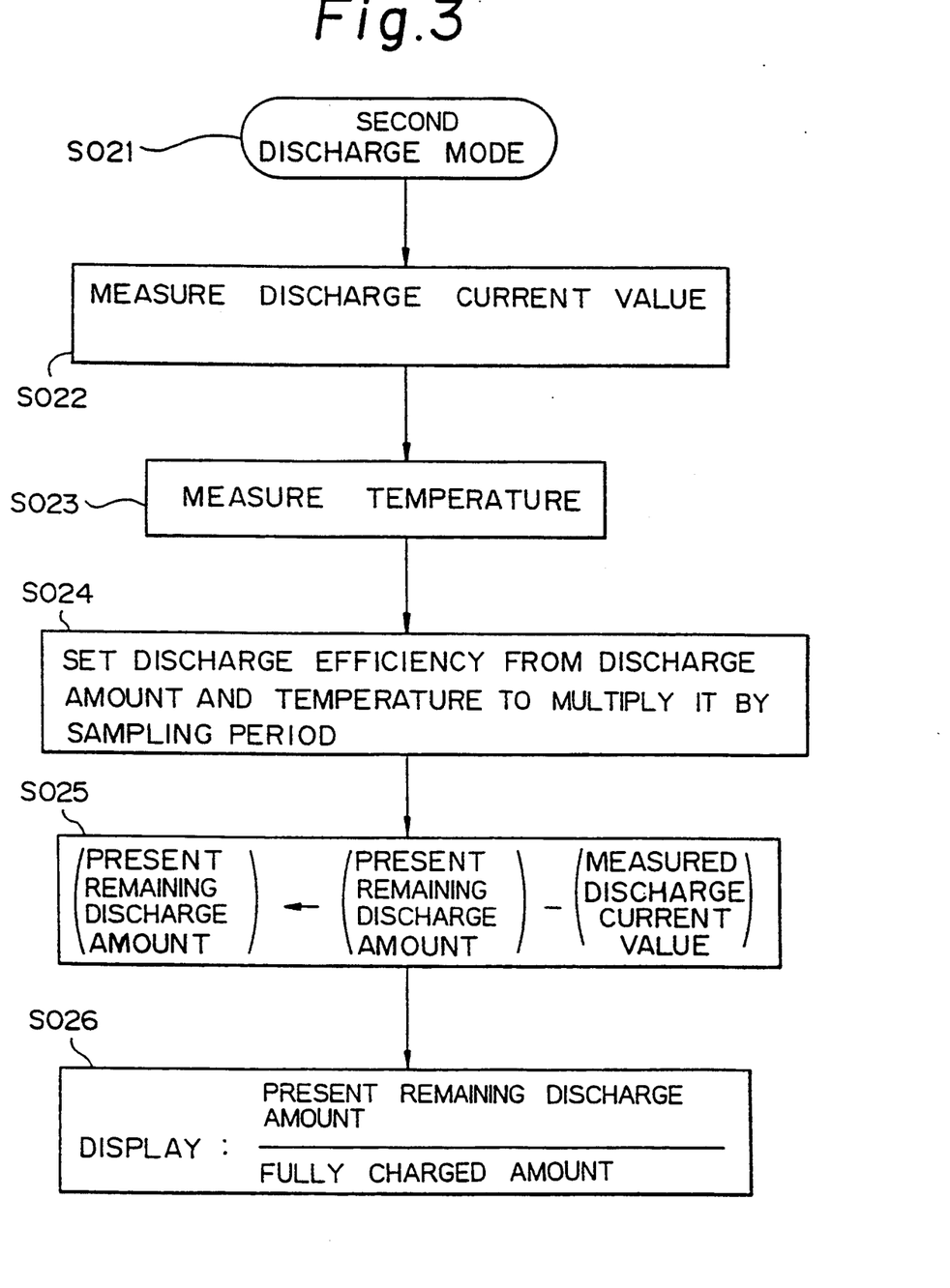
FIG. 3 is a flowchart showing a second discharge mode in the method in accordance with the present invention.

FIG. 3 is a view showing a series of steps in a second discharge mode shown. In the discharge mode in FIG. 2, it is assumed that if the battery is used in the same environment, the discharge efficiency α is constant, whereas in the case of the discharge mode shown in FIG. 3, it should be noted that the ratio of the discharge amount to the charging amount varies depending on the surrounding temperature or the discharge current. Therefore, not only the discharge current value (discharge amount), but also the temperature is measured and the discharge efficiency is determined from the measured discharge amount and temperature.

The discharge efficiency in FIG. 3 is not obtained by calculation as in FIG. 2, but the discharge efficiency, which is a function of the discharge amount and the temperature, is stored and the discharge efficiency corresponding to the respective variable of the function is read out.

Thus, the discharge efficiency as determined above is multiplied by a sampling period to form a variable sampling period. For example, the discharge efficiency may worsen if the surrounding temperature is low and the discharge amount is large. Therefore, the sampling period is shortened as necessary and the above measured discharge amount is subtracted from the present remaining discharge amount by the shortened sampling period to obtain a new present remaining discharge amount. Then, the obtained present remaining discharge amount is divided by the fully charged amount depending on the required charging time to represent the remaining battery discharge amount (%).

Also, in the discharge mode of FIG. 3, when the voltage value of the battery between both terminals reduces to the discharge-terminating voltage, if the present remaining discharge amount is zero, the present charging amount in the charging mode can be regarded as zero.

Figure 5:
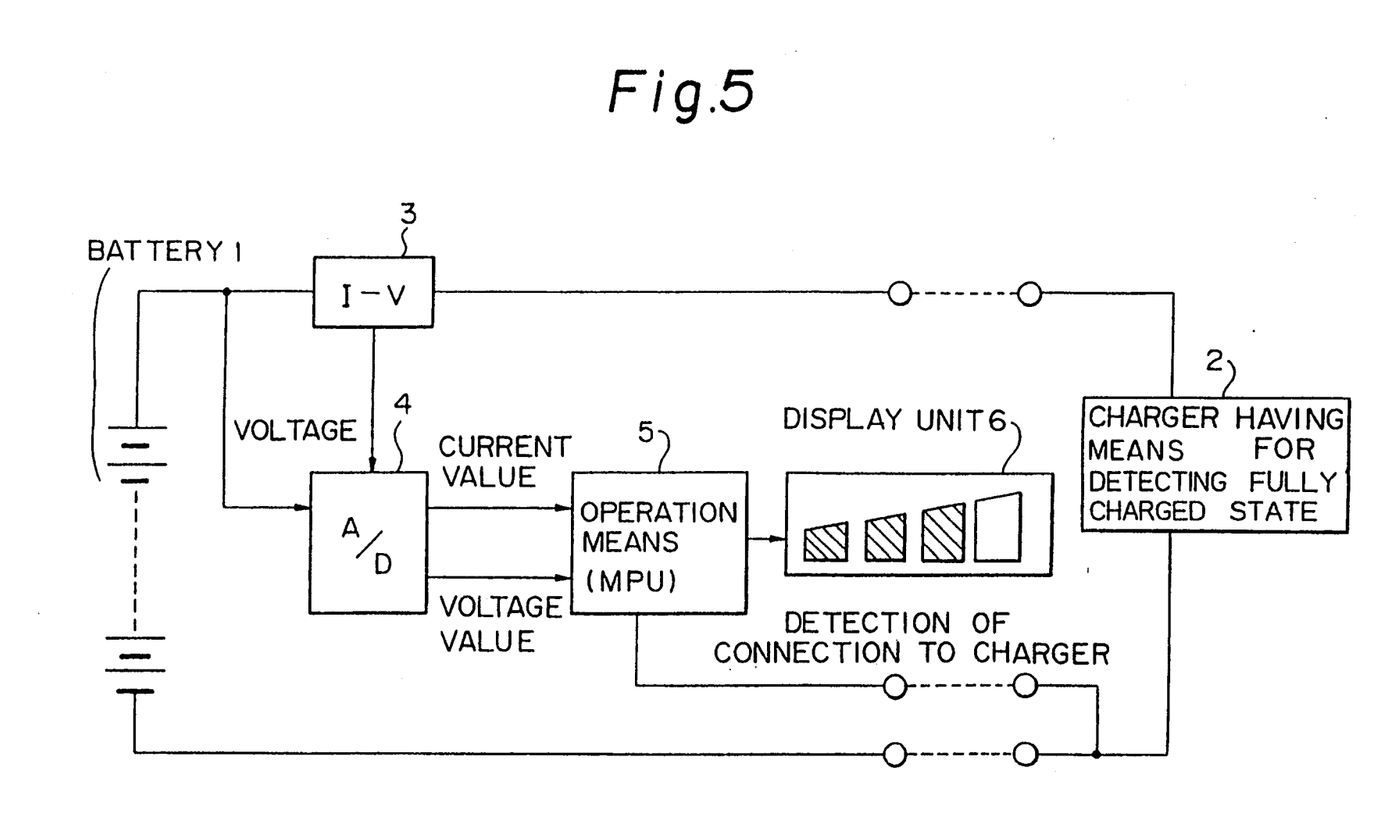
FIG. 5 is a block diagram showing a first embodiment of the device for indicating a residual capacity of a battery in accordance with the present invention.

FIG. 5 is a view showing a device for performing the method for representing the residual capacity of a battery in accordance with the present invention as shown in FIGS. 1 and 2.

In FIG. 5, reference numeral 1 denotes a battery, 2 a charger having a function for detecting a fully charged state, 3 a current-to-voltage conversion circuit which detects a charging current value (charging amount) flowing from the charger 2 to the battery 1 during charging or a discharging current value (discharge amount) from the battery 1 when the charger 2 is removed and converts the detected value into a corresponding voltage value, 4 an analog-to-digital converter for outputting a current value represented by a voltage value from the current-voltage conversion circuit 3 and a voltage value between both terminals of the battery 1, in the forth of a digital signal, 5 an operation control means or a microprocessor unit (MPU) means for controlling the operation in the charging mode shown in FIG. 1 and the discharge mode shown in FIG. 2, upon receiving a digital current value and digital voltage value from the A/D converter 4, and 6 a display unit for displaying the result of an operation carried out by the operation control means 5.

The operation control means 5 is formed such that the mounting or unmounting of the charger 2 can be detected and in order to enter the charging mode shown in FIG. 1, the charged current value is obtained from the voltage value output by the A/D converter 4 in the case of the charging mode where the charger 2 is connected therewith. If the required charging current value is more than a trickle charging current value, the present charging amount is defined by a sum of the present charging amount and the charging current value, and a ratio of the full charging amount to the present charging amount is output to the display unit 6. On the other hand, if the required charging current value is less than the trickle charging amount, the above present charging amount is regarded as the full charging amount to be updated and a fully charged state is indicated by the display unit 6.

In order to enable the discharge mode shown in FIG. 2, the present charging amount is multiplied by a discharge efficiency which is the ratio of the latest dischargeable amount to the fully charged amount, to calculate the present remaining discharge amount. At the same time, the discharge current value is determined by the current-to-voltage conversion circuit 3 and A/D converter 4, and the determined discharge current value is subtracted from the calculated present remaining discharge amount, and then the ratio of the present discharge amount to the latest dischargeable amount is indicated by the display unit 6. Then, when the voltage value of the battery 1 which was detected through the A/D converter 4 reaches the discharge-terminating voltage, the latest dischargeable amount is obtained from the present remaining discharge amount.

When the operation control means 5 returns to the charging mode before the voltage value has reached the discharge-terminating voltage in the discharge mode, the present remaining discharge amount is divided by the discharge efficiency to convert the divided quotient into the present charging amount.

Figure 6:
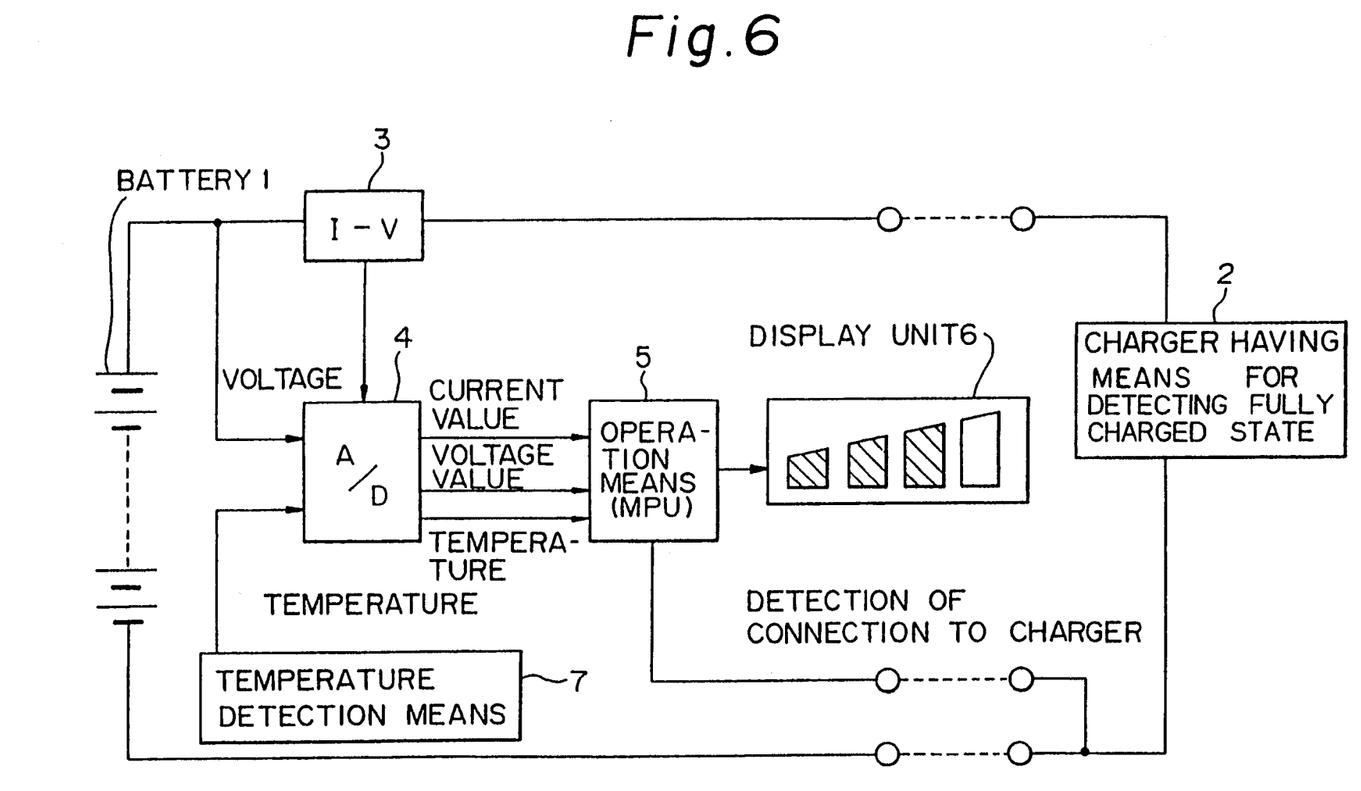
FIG. 6 is a block diagram showing a second embodiment of the device in accordance with the present invention.

FIG. 6 is a view showing a device for initiating the charging mode shown in FIG. 1 and the discharge mode shown in FIG. 3. The difference between the present device and the device shown in FIG. 5 is that a temperature detection means 7 is provided with the output signal thereof being supplied to the A/D converter 4, and the temperature data is transferred to the operation control means 5.

In order to operate in the discharge mode shown in FIG. 6, the operation control means (or MPU) 5 receives a discharge current value in the case of the discharge mode where the charger 2 is not connected to the battery 1, from the current-to-voltage conversion circuit 3 and the A/D converter 4. At the same time, the operation control means 5 receives the temperature data through the A/D converter 4, and a present remaining discharge amount is calculated by subtracting the discharge current value from the present remaining discharge value, and a ratio of the present charging amount to the fully charged amount in the charging mode is indicated by the display unit 6.

Figure 7:
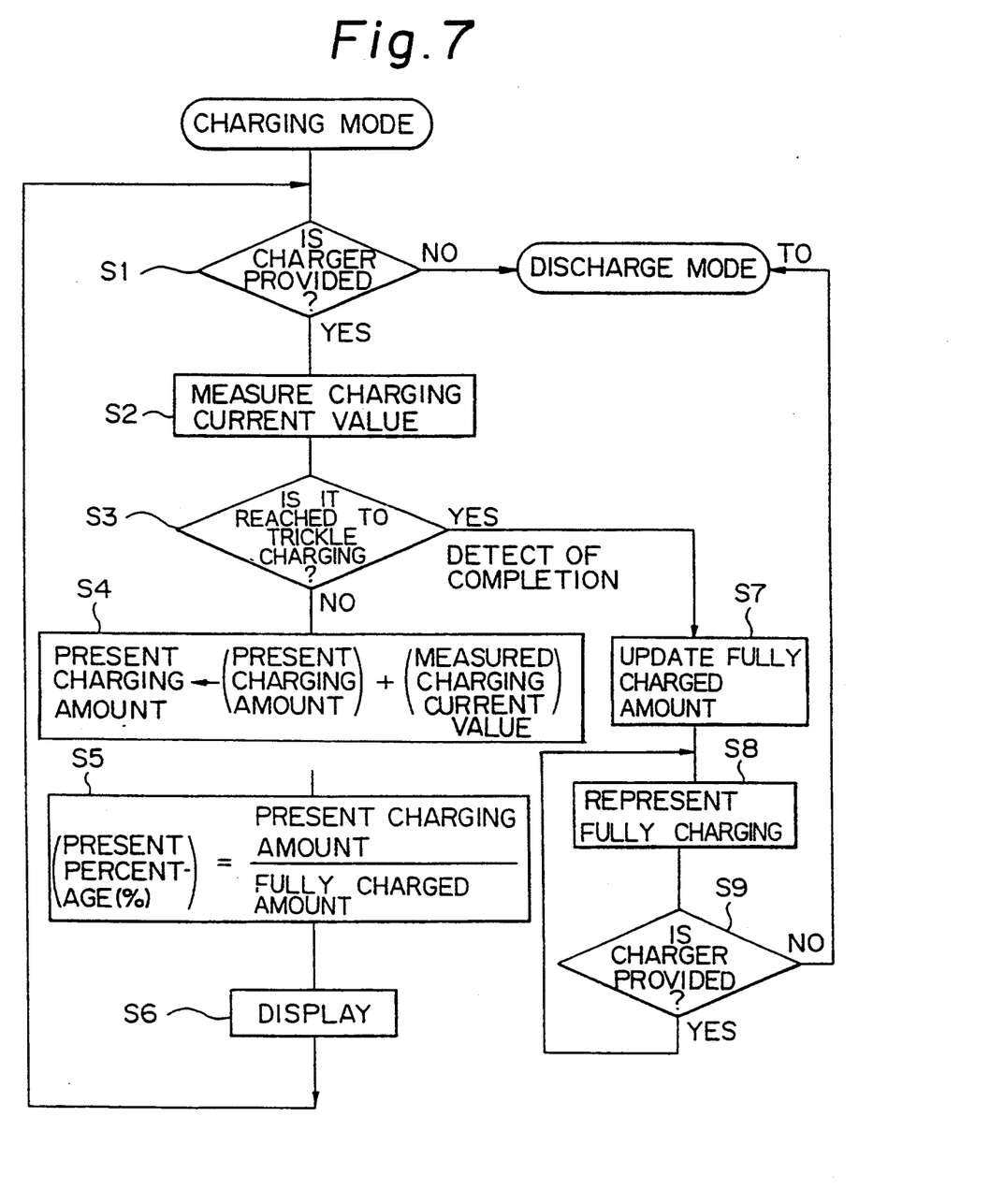
FIG. 7 is a flowchart showing the operational steps of the charging mode in the device of the present invention.

FIG. 7 is a flowchart showing operational steps in a charging mode shown in FIG. 1 that includes an operational algorithm which is executed by a microprocessor (MPU) 5 in the operation control means shown in FIG. 5.

The operation of the display device showing the residual capacity of a battery shown in FIG. 5 and the method for representing the residual capacity of the battery shown in FIG. 1 will be described.

A microprocessor 5 determines whether or not a charger 2 is provided (Step S1). When the charger 2 is not provided or connected to the battery, the process transfers to the discharge mode (Subroutine T0), whereas when the charger 2 is provided or connected to the battery, the process proceeds to a step of measurement of a charging current value (Charging amount) through the current-to-voltage conversion circuit 3 and the A/D converter 4 (Step S2).

Then, the charging operation proceeds and the process discriminates whether a trickle charging has begun or not, that is, whether or not charging has been completed, from the charging current value measured in the step S2 (Step S3). As described at first, since the present charger is equipped with a sensor for detecting a fully charged state, if a state of trickle charging is entered, the charging current will always change. In the prior art trickle charger, a microcurrent always flows from the beginning of a charging process, and it is difficult to discriminate whether or not trickle charging has begun. However, with a charger having the function for detecting a fully charged state, it is possible to discriminate easily whether or not trickle charging has begun.

If trickle charging has not started, the normal charging operation continues. Therefore, the addition of the present charging amount (which was regarded as being zero when the charging started), to the measured charging current value obtained in the step S2 enables calculation of the present charging amount (Step S4).

The present charging amount obtained in step S4 is then divided by the fully charged amount (which means a charging amount of a constant value that is given in advance, and thereafter values are obtained by the fully charged remaining amount in the preceding discharge mode) to indicate the residual battery capacity in %. (Steps S5 and S6).

In the above-described Steps S1 to S6, the charger 2 is mounted and the process is continued until the trickle charging begins. When the trickle charging begins, the present charging amount at that time point obtained by step S4 is judged as the fully charged amount (Step S7), to indicate a fully charged state (Step S8), and whether or not the charger 2 is provided or connected is determined (Step S9). Then, at a step where the charger 2 is removed, a discharge mode (Subroutine T0) is initiated.

Figure 8A:
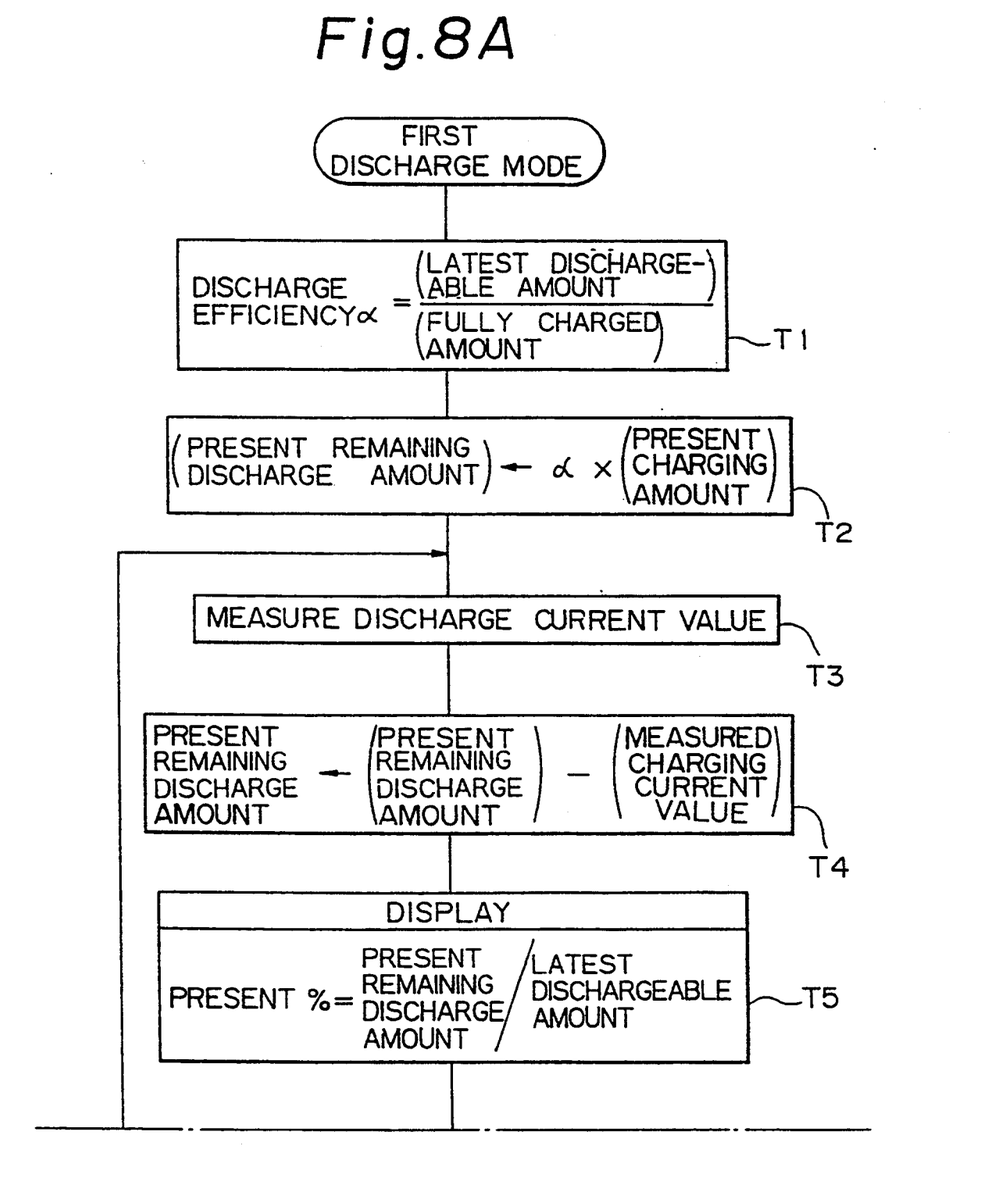
FIGS. 8A and 8B form a flowchart showing the operational steps in a first discharge mode in the present invention.
Figure 8B:
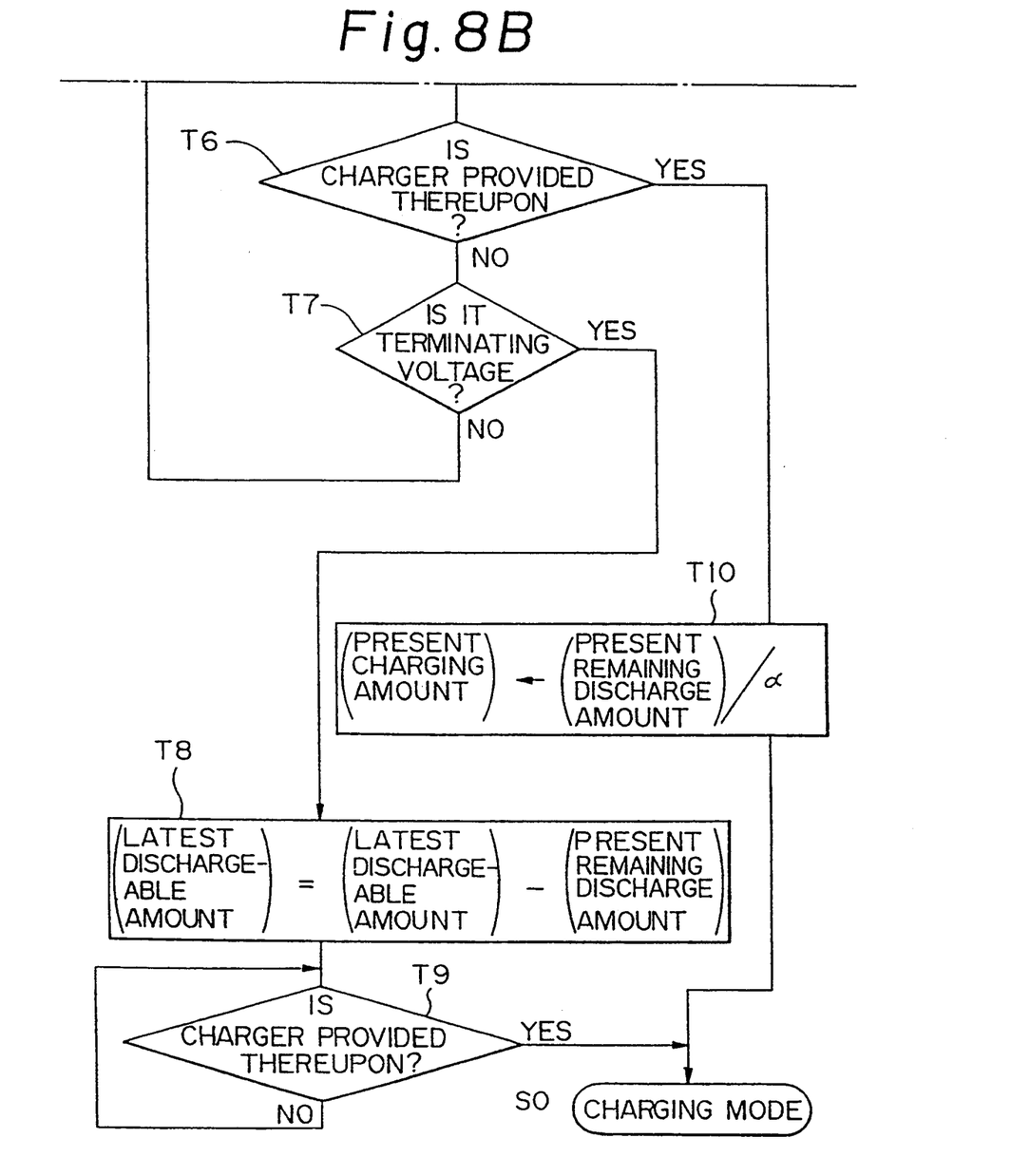

FIGS. 8A and 8B show operational steps in a first discharge mode shown in FIG. 2 and illustrate a flowchart showing an operational algorithm which is executed by a microprocessor 5 shown in FIG. 5.

The flowchart illustrates a method for indicating the residual capacity of a battery shown in FIG. 2 and the operation of the display device for displaying the residual capacity of the battery shown in FIG. 5.

First, the microprocessor 5 divides a latest dischargeable amount by a full charging amount to obtain a discharge efficiency $\alpha$ (Step T1).

The latest dischargeable amount defining the discharge efficiency α, is obtained by step T8 described hereinafter. The fully charged amount shows the updated fully charged amount shown in step S7 of FIG. 7.

If the discharge efficiency α obtained above is multiplied by the present charging amount (Step T2), an equivalent present remaining dischargeable capacity will be obtained. In this case, the present charging amount is the present charging amount obtained in step S4 of FIG. 7, and if the operation in the charging mode in FIG. 7 is performed up to the point of trickle charging, the present charging amount will be the full charging amount.

Thereafter, the microprocessor 5 determines a discharge current value through a current-to-voltage converting circuit 3 and an analog-to-digital converter 4 (Step T3).

The discharge current value determined in step T3 is subtracted from the present remaining discharge amount obtained in the above step T2 to be able to calculate the present remaining discharge amount (Step T4) and if the present remaining discharge amount is divided by the latest dischargeable amount, the present remaining discharge amount of the battery can be represented by a percentage (%) (Step T5).

Then, whether or not the discharge mode in which the charger 2 is removed continues is discriminated (Step T6), and if the charger 2 is still removed, the voltage between both terminals of the battery 1 is fetched through the analog-to-digital converter 4 and whether or not the voltage is a discharge-terminating voltage, that is, whether or not discharge has been completed, is discriminated (Step T7). If the voltage has not reached a value of a discharge-terminating voltage, the process returns to the step T3 and the same operation is repeated.

When it becomes clear that the voltage has reached the discharge-terminating voltage in step T7, the present remaining discharge amount (Step T4) is subtracted from the latest dischargeable amount and the discharge amount that is necessary between a period from a state of the present latest dischargeable amount, viz., the fully charged amount (Step S7) until discharge has been completed, can be obtained by a remaining discharge amount when discharge has not yet been completed (Step T8). Then, the process further checks whether or not the charger 2 is provided (Step T9), and transfers to a charging mode (Subroutine SO).

On the other hand, when it becomes clear in step T6 that the process has transferred to a charging mode in which the charger 2 is provided, the present remaining discharge amount (Step T4) is divided by the discharge efficiency α (Step T1) to obtain the present charging amount, and it is left in a converted state so that when the process changes to a charging mode (Subroutine SO), it can be used as the present charging amount.

Figure 9A:
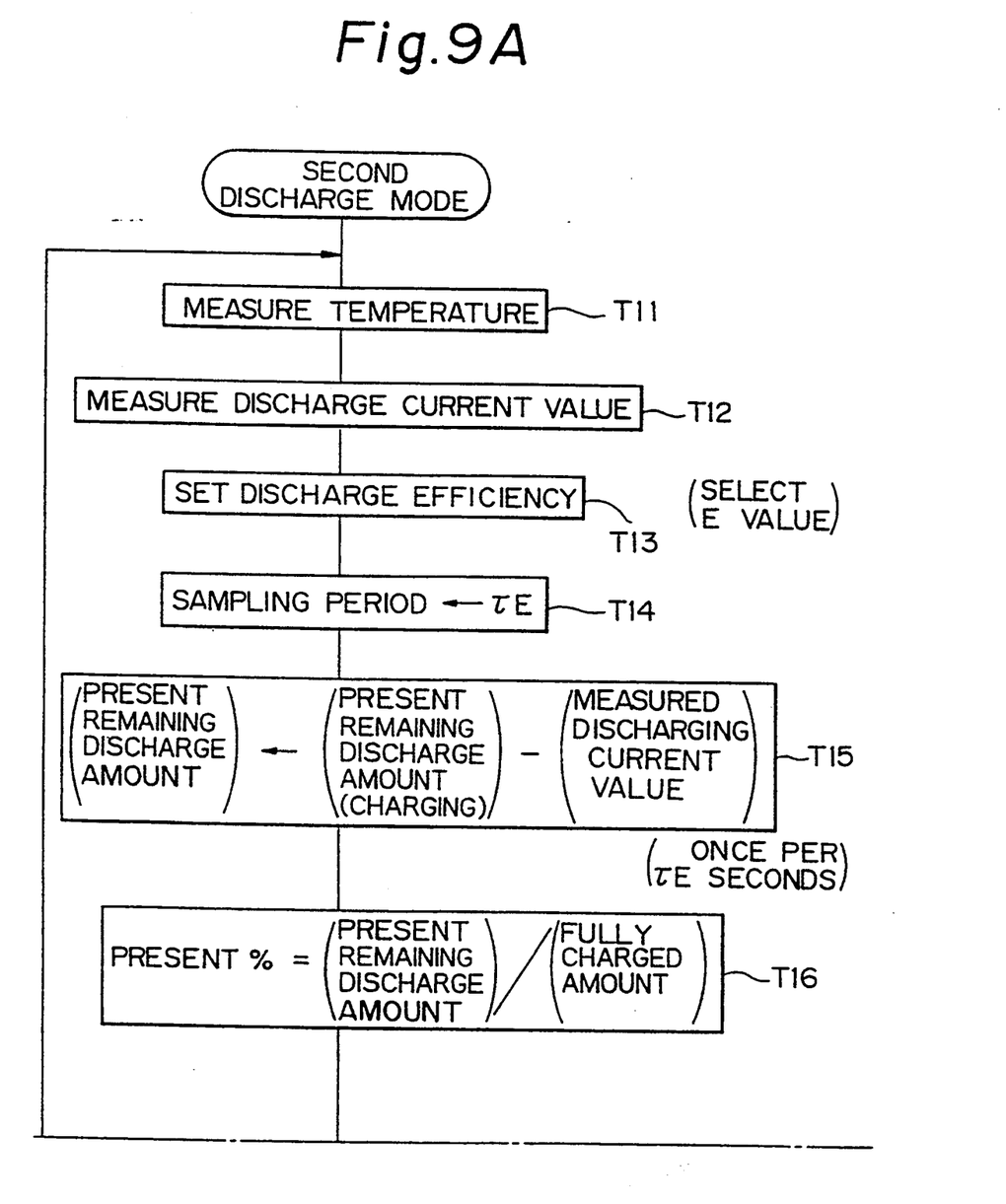
FIGS. 9A and 9B form a flowchart showing the operational steps in a second discharge mode in the present invention.
Figure 9B:
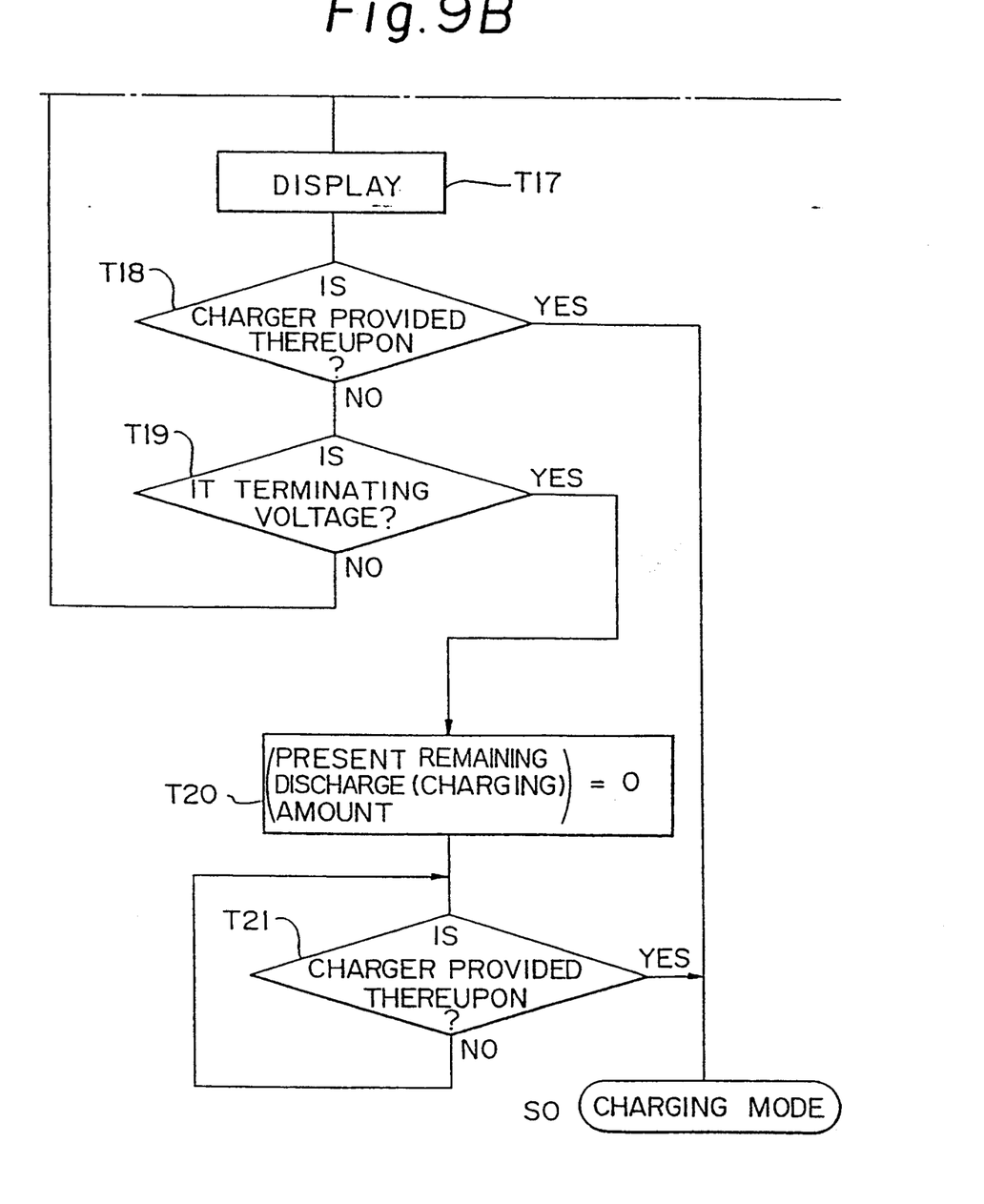

FIGS. 9A and 9B show the operational steps of discharge mode shown in FIG. 3, and illustrate a flowchart showing an operational algorithm that is executed by the microprocessor 5 in the device shown in FIG. 6.

As shown in the flowchart, a method for indicating the residual capacity of a battery shown in FIG. 3 and the operation of the display device for displaying the residual amount of the battery shown in FIG. 6 is carried out.

First, the microprocessor 5 reads a temperature signal from a thermistor 7 of a temperature detection means as temperature data converted by the analog-to-digital converter 4 to effect a temperature measurement (Step T11), and measures the discharge current value as illustrated in FIG. 9A (Step T12).

The discharge efficiency is determined by the thus measured temperature and a discharge current value (Step T13). The value of the discharge efficiency is given as a ratio when a period of an integrating operation in the case of charging shown in FIG. 7 (Step S4) is 1, whereas in the case of discharge a discharge efficiency E is multiplied by a sampling period τ to produce an abridged sampling period τE (Step T14).

Figure 10:
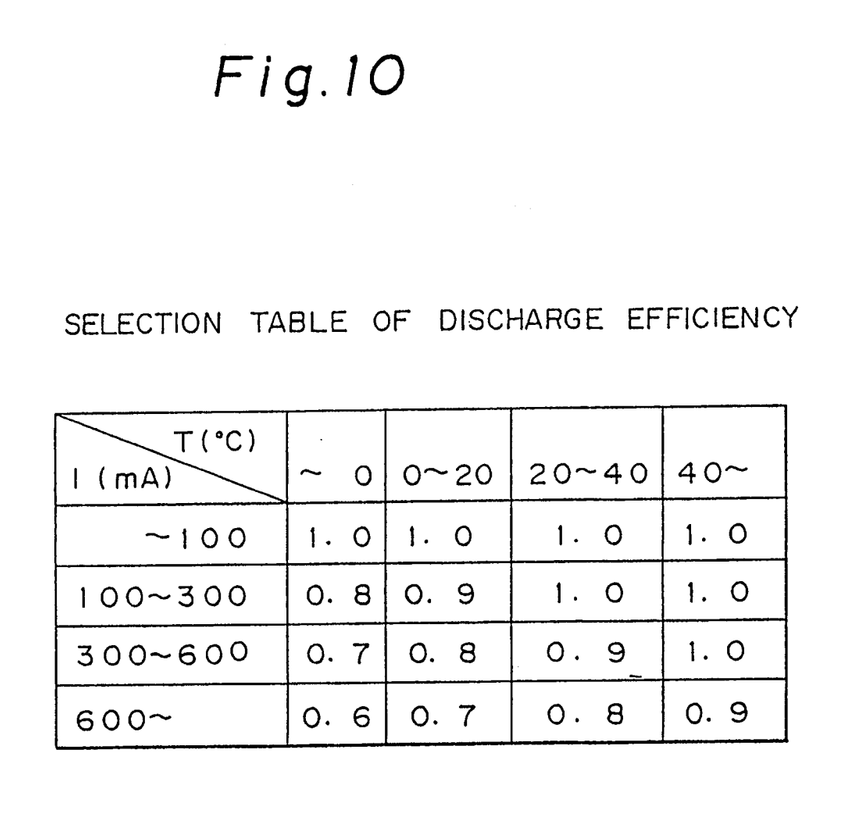
FIG. 10 is a selection table of the discharge efficiency of the present invention.

An example of a selection table for obtaining the discharge efficiency E is shown in FIG. 10. In the figure, at a position where the discharge efficiency is 1.0, discharge is effected for the same period as in the charging mode, but in the case of a ratio other than 1, the period is shorter than the period in the case of charging. For example, in the case where the surrounding temperature is 15° C. and the discharge current value is 200 mA, the discharge efficiency E is equal to 0.9.

The sampling period τE is set in this way, and the measured discharge amount is subtracted from the present remaining discharge amount or the present charging amount for the sampling period, and the present discharge amount is obtained (Step T15).

In other words, since a sampling period changes according to temperature and the discharge current value, the present remaining discharge amount is calculated more frequently and therefore, a more accurate remaining discharge amount can be obtained.

If the so obtained present remaining discharge amount is divided by the full charging amount which is updated by the step S7 in FIG. 7, the obtained present residual capacity of the battery denoted by a percentage and indicated by the display unit 6 (Step T16 and T17).

Further, the operation control means discriminates whether or not the charger 2 is provided (Step T18), and when the charger is provided, the process transfers to the charging mode (Subroutine SO), whereas when the charger is not provided, since the discharge mode is continuing, the operation control means further monitors the voltage between both terminals of the battery 1. If the voltage between both terminals is not a discharge terminating voltage, the process returns to the above step T11 and the same steps are repeated. If the voltage between both terminals reaches a discharge-terminating voltage, the present remaining discharge amount (Charging amount) is made zero (Step T20), and if the charger 2 is provided, the process transfers to the charging mode (Step T21, SO).

Therefore, the present device has a self-learning function in accordance with the latest remaining discharge amount and the pattern of use can represent a correct remaining discharge amount under certain conditions.

We claim:

1. A method for indicating a correct residual capacity of a battery, comprising the steps of:

measuring a charging current value in a current charging mode when a charger having a function for detecting a fully charged state is connected to the battery;

adding, if the charging current value in the charging mode is more than trickle charging current value, said measured charging amount to a present charging amount to obtain a new present charging amount and thereby indicating a ratio of the new present charging amount to a fully charged state; and judging, if the charging current value in the charging mode is less than the trickle charging current value, by determining a charged amount from the charging current value, the present charging amount as being the fully charged amount and indicating that the present charging amount is in a fully charged state.

2. The method according to claim 1, wherein said method further comprises the steps of:
measuring a discharge current value in a discharge mode in which said charger is not connected to said battery;
determining a discharge efficiency;
multiplying the present charging amount by said discharge efficiency to calculate a present remaining discharge amount;
subtracting said measured discharge current value from said calculated present remaining discharge amount to calculate the present remaining discharge amount and indicating a ratio of a latest dischargeable amount to said present remaining discharge amount; and
obtaining, when a voltage value of said battery reaches a discharge terminating voltage, said latest dischargeable amount from a remaining amount that could not be discharged in a preceding discharge mode.

3. The method according to claim 2, wherein said method comprises the steps of:
dividing said present remaining discharge amount by said discharge efficiency when in said discharge mode, when a process of the method returns to said charging mode before said voltage reaches a discharge-terminating voltage, to be converted into said present charging amount.

4. The method according to claim 2, and comprising the steps of setting said discharge efficiency determining depending on a detected temperature and said discharge current value; subtracting said discharge current value from said present remaining discharge amount every sampling period which is multiplied by said discharge efficiency, to calculate the present discharge amount; and indicating a ratio of the present charging amount to the fully charged state in the charging mode.

5. The method according to claim 4, wherein when a voltage value of said battery reduces to the discharge-terminated voltage, the present discharge capacity is made zero.

6. A device for indicating a residual capacity of a battery, comprising:
a battery;
a charger connectable to said battery and having means for detecting a fully charged state;
a current-to-voltage converting circuit connected to said battery for converting a charging current value in the case when said charger is connected to said battery, to a voltage value;
an analog-to-digital converter connected to said converting unit for converting said voltage value to a digital value;
an operation control means connected to said converter; and
a display unit;
said operation control means detecting whether or not said charger is connected to said battery and in a charging mode when said charger is connected to said battery, obtaining a charging current value from a voltage value output from said analog-to-digital converter, adding, if said charging current value is more than a trickle charging current value, said charging current value to a present charging amount, to obtain a new present charging amount, and outputting to said display unit a ratio of the new present charging amount to a full charging amount, and at the same time, judging, if said charging current value is less than said trickle charging current value, by determining a charged amount from the charging current value, said present charging amount as being the fully charged amount and making said display unit indicate that the present charging amount is in a fully charged state.

7. The device according to claim 6, wherein in a discharge mode in which said charger is not connected to said battery, said operation control means multiplies said present charging amount by a discharge efficiency which is represented by a ratio of latest dischargeable amount to the full charging amount to determine a present discharge amount, and at the same time, the operation control means determines a discharge current value from said current-to-voltage converting circuit and said analog-to-digital converter, subtracts said determined discharge current value from said determined present discharge amount to obtain the present discharge amount, and a ratio of said present discharge amount to said latest dischargeable amount is indicated on said display unit and, when a voltage value of said battery detected via said analog-to-digital converter attains a discharge-terminating voltage, the operation control means obtains said latest dischargeable amount from said present discharge amount.

8. The device according to claim 7, wherein in said discharge mode, before said voltage value attains a discharge-terminating voltage, when said operation control means returns to said charging mode, said operation control means divides said present discharge amount by said discharge efficiency to derive said present charging amount.

9. The device according to claim 6, and further comprising a temperature measuring means connected to said analog-to-digital converter wherein said operation control means receives a discharge current value in a discharge mode in which said charger is not connected to said battery, from said current-to-voltage converting circuit and said analog-to-digital converter receives a temperature value through said analog-to-digital converter, subtracts said discharge current value from said present remaining discharge amount every sampling period which is multiplied by a discharge efficiency depending on said temperature value and said discharge current value, to calculate the present remaining discharge amount, and a ratio of the present charging amount to the full charging amount in a charging mode is indicated on said display unit.

10. The device according to claim 9, wherein said analog-to-digital converter converts a voltage of said battery into a digital value and when the voltage of said battery is reduced to a discharge-terminating voltage, said operation control means makes said present discharge amount a zero value.

11. The method according to claim 2, wherein said discharge efficiency is determined by a ratio of a latest dischargeable amount to the fully charged amount.

* * * * *